(12) United States Patent
Huang et al.

(10) Patent No.: US 6,692,985 B2
(45) Date of Patent: Feb. 17, 2004

(54) SOLAR CELL SUBSTRATE WITH THIN FILM POLYSILICON

(75) Inventors: Chorng-Jye Huang, Tainan (TW); Lee Ching Kuo, Hsinchu (TW); Jyi Tyan Yeh, Hsinchu (TW); Chien Sheng Huang, Hsinchu (TW); Leo C. K. Liau, Taoyuan (TW); Shih-Chen Lin, Taipei (TW); Cheng-Ting Chen, Taoyuan (TW); Feng-Cheng Jeng, Miaoli (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/163,432

(22) Filed: Jun. 7, 2002

(65) Prior Publication Data

US 2002/0185171 A1 Dec. 12, 2002

(30) Foreign Application Priority Data

Jun. 7, 2001 (TW) ........................................ 90113818 A

(51) Int. Cl.[7] ..................... H01L 31/18; H01L 31/0368; H01L 31/04

(52) U.S. Cl. ............... 438/97; 438/98; 438/96; 438/488; 136/258; 136/261; 136/255; 136/256; 257/66; 257/464

(58) Field of Search ............................. 136/258, 261, 136/255, 256; 257/66, 464; 438/97, 98, 96, 488

(56) References Cited

U.S. PATENT DOCUMENTS

| | | | | |
|---|---|---|---|---|
| 3,978,333 A | * | 8/1976 | Crisman et al. | 136/255 |
| 4,781,766 A | * | 11/1988 | Barnett et al. | 136/258 |
| 5,221,854 A | * | 6/1993 | Banerjee et al. | 257/431 |
| 6,229,084 B1 | * | 5/2001 | Katsu | 136/255 |
| 6,277,667 B1 | * | 8/2001 | Huang et al. | 438/57 |

* cited by examiner

*Primary Examiner*—Alan Diamond
(74) *Attorney, Agent, or Firm*—Birch, Stewart, Kolasch & Birch, LLP

(57) ABSTRACT

A solar cell substrate with thin film polysilicon. The solar cell substrate includes a substrate; a transparent conductive layer, formed on the substrate; a thermal isolation layer having inlaid conductive layers, formed on the transparent conductive layer; and a polysilicon layer, formed on the thermal isolation layer.

16 Claims, 6 Drawing Sheets

SOLAR CELL SUBSTRATE WITH THIN FILM POLYSILICON

BACKGROUND OF THE INVENTION

1. Field of the Invention

The present invention relates to a Si solar cell substrate. In particular, the invention relates to the structure of a solar cell substrate formed with thin film polysilicon.

2. Description of the Prior Art

Examples of current solar cells are Si, GaAs and CuInSe2, with the most accepted among the three being the Si solar cell. Advantages of Si solar cell include reasonable emission efficiency and production costs. Three types of Si solar cell are single crystal silicon, polysilicon, and amorphous silicon. Single crystal silicon and polysilicon exhibit higher efficiency, while amorphous solar cell, though cost-saving, is not as good, as stability is not satisfactory after emitting light. Recently, solar cells with thin film polysilicon has been developed to lower production costs for Si solar cells.

Production costs for solar cells with thin film polysilicon are quite low, because glass is used as substrate. In addition, they provide a large area and exhibit excellent semiconductor characteristics. Consequently, they have become a highly studied subject in this field.

Solar cell applications with thin film polysilicon are extensive, for instance, sensors, solar cells, thin film transistors etc. The most promising fabrication process at the moment is laser nucleation, followed by annealing of the nucleus amorphous silicon thin film to cause growth of silicon grains. A conventional solar cell substrate is shown in FIG. 1, where a polysilicon layer 6 is formed on a substrate 2 covered with a conductive layer 4. Using traditional method, grain size rarely exceeds 1 $\mu$m, and is usually in the range of 0.01–10.5 $\mu$m. However, larger grain size is preferable, as defect probability for electrons/holes to be trapped in the grain boundary is greatly reduced. By having greater sizes of Si grains, mobility and diffusion length are increased, thereby enhancing characteristics of the elements made thereof.

SUMMARY OF THE INVENTION

It is an object of the invention to provide a novel solar cell substrate with thin film polysilicon. By having a patternable thermal conducting layer and at least two different thermal conducting layers, polysilicon with larger grains is formed as a result induced by driving force for lateral growth.

In order to achieve the above objects, there is provided a solar cell substrate with thin film polysilicon, comprised of a substrate; a transparent conductive layer, formed on the substrate; a thermal isolation layer having inlaid conductive layers, formed on the transparent conductive layer; and a polysilicon layer, formed on the thermal isolation layer. The substrate is shown in FIG. 2, where a transparent conductive layer 4, thermal isolation layer 8 having inlaid conductive layer 7 and polysilicon layer 6 are sequentially formed on the substrate 2.

The substrate is conductive or non-conductive. The formation of the transparent conductive layer is omitted when using a conductive substrate. An example of a non-conductive substrate is glass.

Preferred thermal isolation layer is made of dielectric material, such as $SiO_2$. The conductive layer inlaid in the thermal isolation layer is not restricted to specific material, any conductive material can be used.

Similarly, there is no limitation for the pattern of the conductive layer inlaid in the thermal isolation layer. It can be arranged in a matrix format.

According to the solar cell substrate with thin film polysilicon provided in the invention, conventional follow-up process is applicable to fabricate P type or N type of solar cell by forming PN of PIN junctions.

The present invention will become more fully understood from the detailed description given hereinbelow and the accompanying drawings, given by way of illustration only and thus not intended to be limitative of the present invention.

DETAILED DESCRIPTION OF THE INVENTION

FIGS. 3–11, illustrate the process for fabricating the solar cell substrate with thin film polysilicon of the invention.

Figure 1:
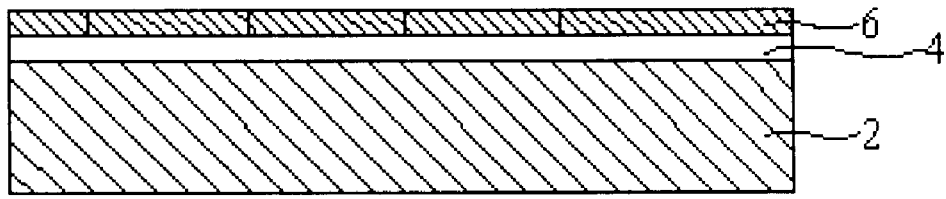
FIG. 1 illustrates a cross section of a conventional solar cell substrate.
Figure 2:
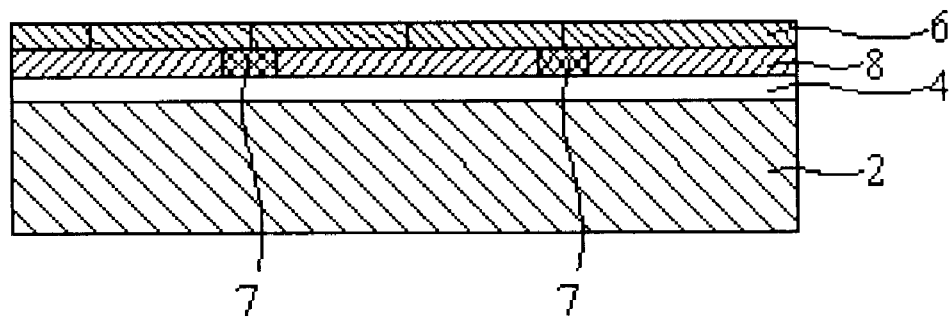
FIG. 2 is a cross section of the solar cell substrate with thin film polysilicon provided in the invention.
Figure 3:
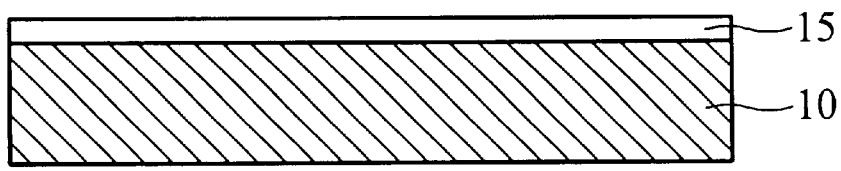
FIGS. 3–11 illustrate the process of fabricating the solar cell substrate with thin film polysilicon according to the invention.
Figure 4:
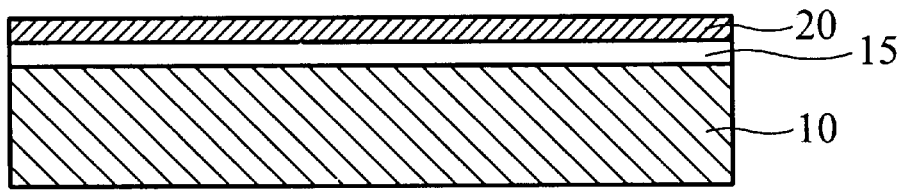
Figure 5:
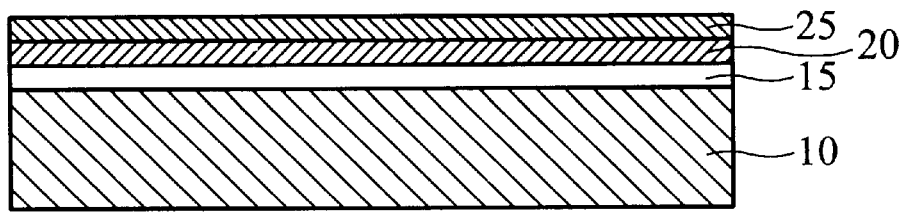
Figure 6:
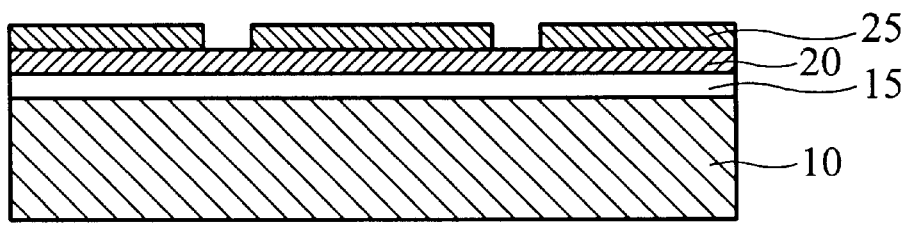
Figure 7:
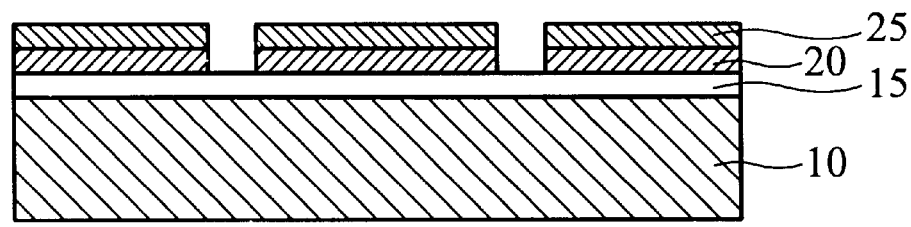

A substrate 10 of glass is provided, as shown in FIGS. 3 and 4. A transparent conductive layer 15 (ITO) and a thermal isolation layer 20, made of $SiO_2$ are sequentially formed on the substrate 10. Next, an iso-phase polymer film is formed on the thermal isolation layer 20, as shown in FIG. 5. The polymer film 25 is then heated to form voids, as shown in FIG. 6.

Figure 8:
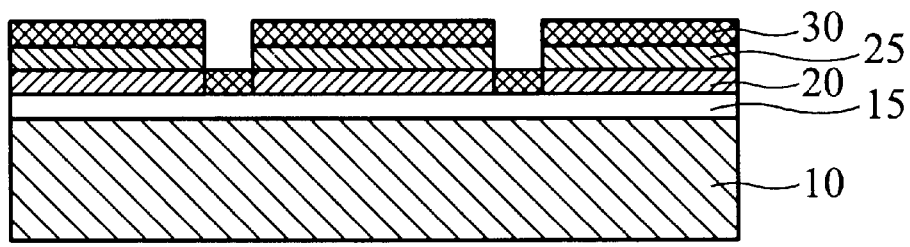
Figure 9:
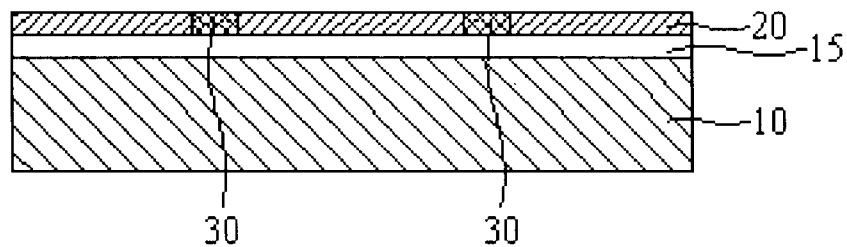

Next, the thermal isolation layer 20 in the voices are removed by etching (shown in FIG. 7), followed by formation of a conductive layer 30 in the voids by vapor deposition, as shown in FIG. 8. The polymer film 25 and the conductive layer 30 thereon are then removed, thus part of the conductive layer 30 remains in the voids of the thermal isolation layer 20, as shown in FIG. 9. That is, the thermal isolation layer 20 with inlaid conductive layer 30 is formed on the transparent conductive layer 15.

Figure 10:
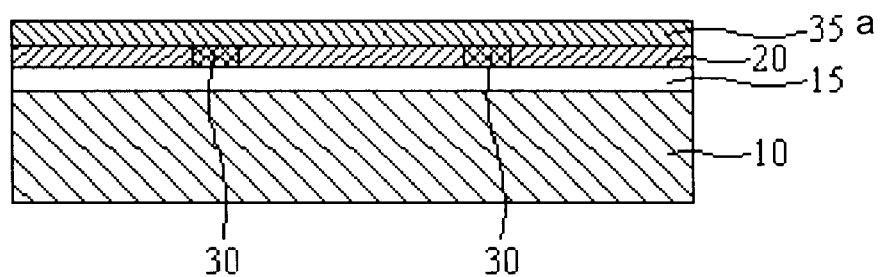
Figure 11:
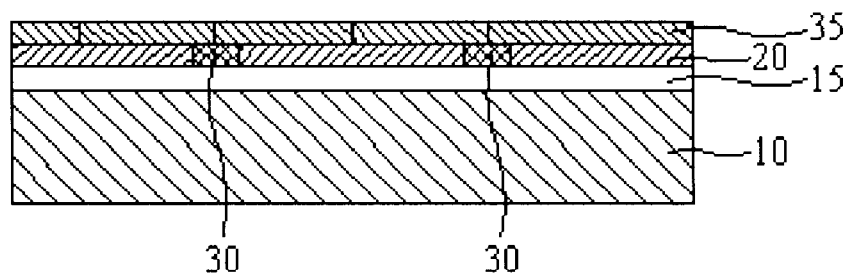

Then, referring to FIG. 10, an amorphous silicon film 35a is formed on the thermal isolation layer 20 with inlaid conductive layer 30. Laser is then used to transform the amorphous silicon film 35a to polysilicon layer 35, as shown in FIG. 11. A thermal treatment is then performed to cause growth of large sized grains in the polysilicon layer 35.

Follow-up conventional method can then be used to form a solar cell using the solar cell substrate obtained by forming PN or PIN junction and electrodes.

Figure 12:
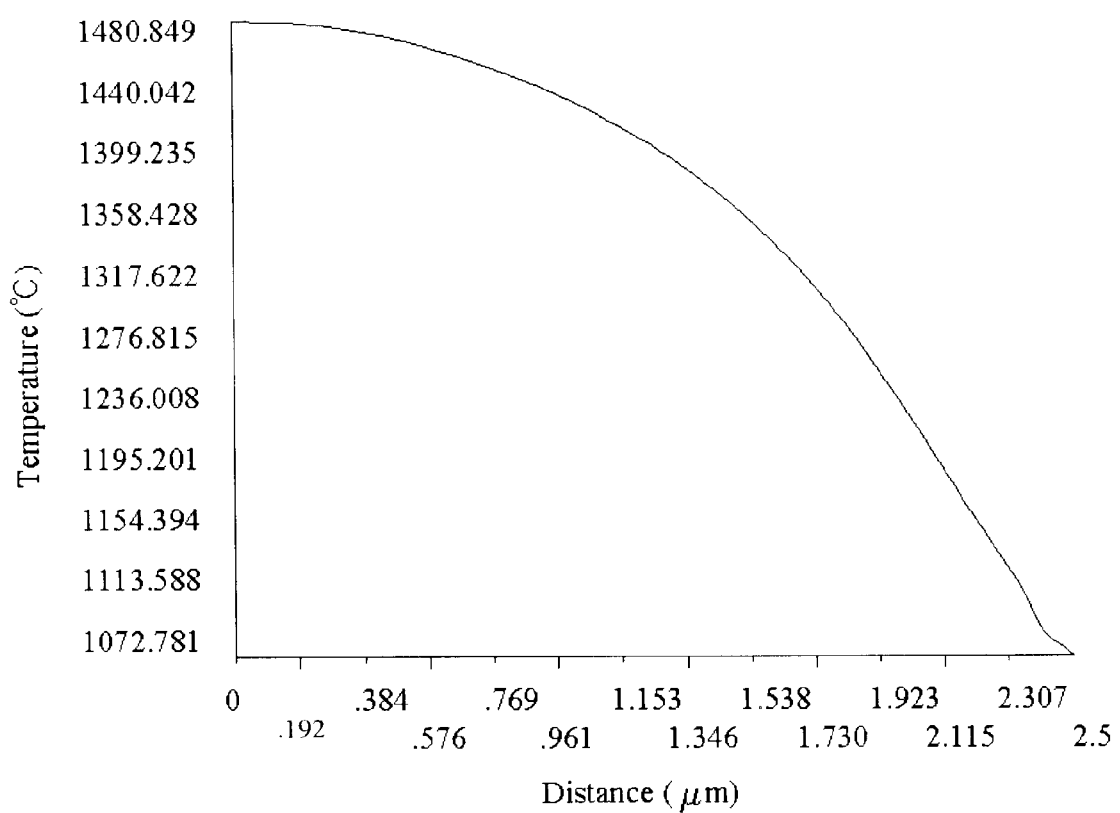
FIG. 12 is a graphical representation of the temperature distribution of the solar cell substrate fabricated in the embodiment of the invention while subjected to laser shoot with 20 ns pulse width.
Figure 13:
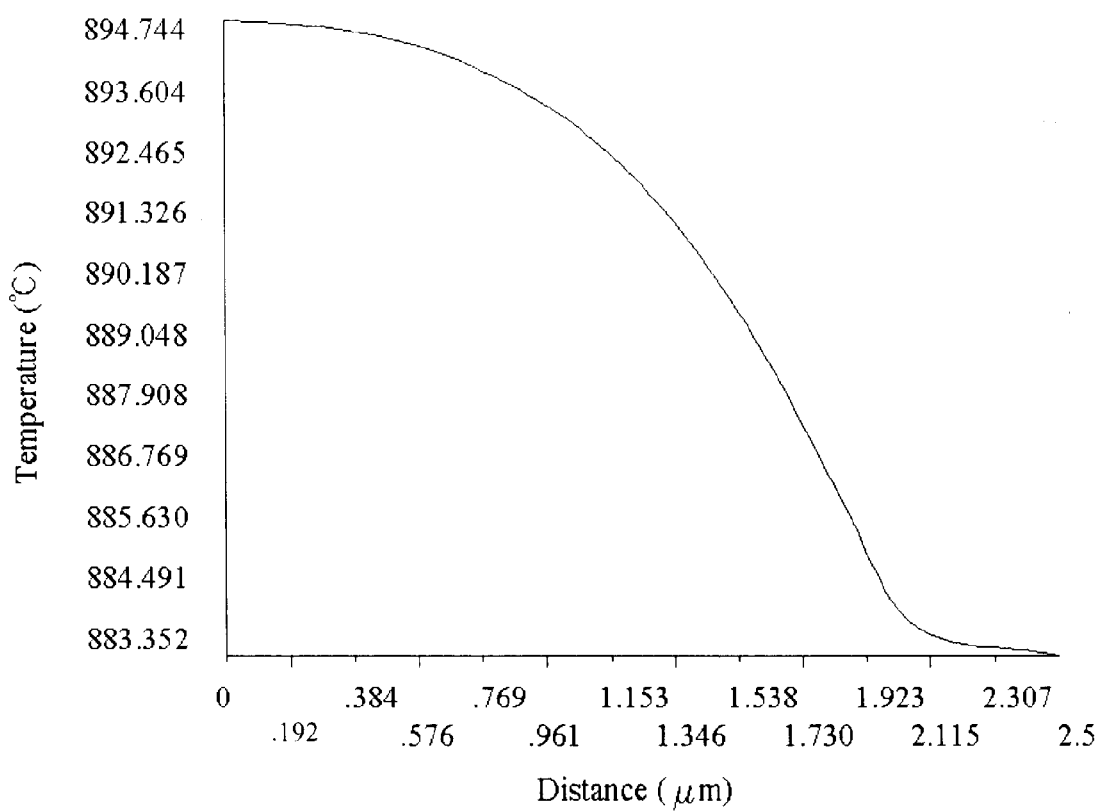
FIG. 13 is a graphical representation of the temperature distribution of the solar cell substrate fabricated in the embodiment of the invention while subjected to laser shoot with 20 ns pulse width.

FIGS. 12 and 13 illustrate the temperature distribution of the solar cell substrate subjected to laser with 20 ns pulse width at 20 ns and 500 ns respectively. X-axis represents the lateral distance along the substrate ($\mu$m) and Y-axis represents temperature (° C.). It is observed that when the amorphous film is subjected to laser, differences of heat capacitance and heat conductance are caused by the inlaid conductive layer 30, thereby resulting in two temperature distributions. As time increases, surface temperature goes down and the slope of the temperature is alleviated. In addition, regions across the substrate are wider, thus enhancing lateral growth of grains in the amorphous silicon layer.

Thus, conductive layers become electrodes and act as a heat sink. The patterned conductive layer having at least two regions with different conductance helps the growth of grains by providing driving force for lateral growth. Consequently, polysilicon of larger grains is formed.

The foregoing description of the preferred embodiments of this invention has been presented for purposes of illustration and description. Obvious modifications or variations are possible in light of the above teaching. The embodiments are chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of forming a solar cell substrate with thin film polysilicon, comprising the steps of:

providing a substrate;

forming a transparent conductive layer on the substrate;

forming a thermal isolation layer on the transparent conductive layer;

forming voids in the thermal isolation layer, wherein the voids expose part of the transparent conductive layer;

forming inlaid conductive layers in the voids;

forming an amorphous silicon layer on the thermal isolation layer and the inlaid conductive layers; and performing a laser heat treatment to transform the amorphous silicon layer to a polysilicon layer;

wherein the thermal isolation layer and the inlaid conductive layers cause the amorphous silicon layer to have different temperature distributions, thereby enhancing lateral growth of grains in the amorphous silicon layer.

2. The method according to claim 1, wherein the substrate is a conductive or non-conductive layer.

3. The method according to claim 2, wherein the non-conductive layer is a glass layer.

4. The method according to claim 1, wherein the transparent conductive layer is an ITO layer.

5. The method according to claim 1, wherein the thermal isolation layer is a dielectric layer.

6. The method according to claim 4, wherein the thermal isolation layer is a $SiO_2$ layer.

7. The method according to claim 1, wherein the inlaid conductive layers are arranged in a matrix within the thermal isolation layer.

8. The method according to claim 1, wherein the inlaid conductive layers serve as heat sinks to cause the amorphous silicon layer to have differences of heat capacitance and heat conductance.

9. A method of forming a solar cell substrate with thin film polysilicon, comprising the steps of:

providing a substrate;

forming a transparent conductive layer on the substrate;

forming a thermal isolation layer on the transparent conductive layer;

forming a polymer film on the thermal isolation layer;

forming voids in the polymer film, wherein the voids expose the thermal isolation layer;

removing the thermal isolation layer in the voids to expose the transparent conductive layer therein;

forming a conductive layer on the polymer layer and in the voids;

removing the polymer layer and the conductive layer thereon to form inlaid conductive layers in the voids;

forming an amorphous silicon layer on the thermal isolation layer and the inlaid conductive layers; and performing a laser heat treatment to transform the amorphous silicon layer to a polysilicon layer;

wherein the thermal isolation layer and the inlaid conductive layers cause the amorphous silicon layer to have different temperature distributions, thereby enhancing lateral growth of grains in the amorphous silicon layer.

10. The method according to claim 9, wherein the substrate is a conductive or non-conductive layer.

11. The method according to claim 10, wherein the non-conductive layer is a glass layer.

12. The method according to claim 9, wherein the transparent conductive layer is an ITO layer.

13. The method according to claim 9, wherein the thermal isolation layer is a dielectric layer.

14. The method according to claim 13, wherein the thermal isolation layer is a $SiO_2$ layer.

15. The method according to claim 9, wherein the inlaid conductive layers are arranged in a matrix within the thermal isolation layer.

16. The method according to claim 9, wherein the inlaid conductive layers serve as heat sinks to cause the amorphous silicon layer to have differences of heat capacitance and heat conductance.

* * * * *